United States Patent
Asano et al.

(10) Patent No.: US 7,530,819 B2
(45) Date of Patent: May 12, 2009

(54) DEVICE FOR CONTROLLING A VEHICLE

(75) Inventors: Masahiko Asano, Mito (JP); Yasuo Akutsu, Mito (JP); Shuji Eguchi, Naka (JP); Kunito Nakatsuru, Mito (JP); Kaoru Uchiyama, Naka (JP)

(73) Assignees: Hitachi, Ltd., Tokyo (JP); Hitachi Car Engineering Co., Ltd., Hitachinaka-shi (JP)

( * ) Notice: Subject to any disclaimer, the term of this patent is extended or adjusted under 35 U.S.C. 154(b) by 0 days.

(21) Appl. No.: 11/976,769

(22) Filed: Oct. 26, 2007

(65) Prior Publication Data
US 2008/0108232 A1    May 8, 2008

Related U.S. Application Data

(63) Continuation of application No. 11/375,057, filed on Mar. 15, 2006, now Pat. No. 7,303,406, which is a continuation of application No. 10/628,352, filed on Jul. 29, 2003, now Pat. No. 7,018,218.

(30) Foreign Application Priority Data
Jul. 30, 2002    (JP)    ............ 2002-221132

(51) Int. Cl.
*H01R 12/00*    (2006.01)
(52) U.S. Cl. .......... 439/76.2; 439/949; 174/50; 361/704; 361/752
(58) Field of Classification Search ........... 174/50; 361/752, 704; 439/76.2, 949
See application file for complete search history.

(56) References Cited

U.S. PATENT DOCUMENTS

| | | | |
|---|---|---|---|
| 4,793,814 A | 12/1988 | Zifcak et al. | |
| 4,936,787 A | 6/1990 | Klein et al. | |
| 5,229,922 A | 7/1993 | Muramatsu et al. | |
| 5,329,422 A | 7/1994 | Sasaki | |
| 6,028,770 A | 2/2000 | Kerner et al. | |
| 6,100,108 A | 8/2000 | Mizuno et al. | |
| 6,195,263 B1 | 2/2001 | Aoike et al. | |

(Continued)

FOREIGN PATENT DOCUMENTS

JP    6-54276 U    7/1994

(Continued)

OTHER PUBLICATIONS

Japanese Office Action dated Feb. 14, 2006 w/English translation Five (5) pages.

(Continued)

*Primary Examiner*—Michael C Zarroli
(74) *Attorney, Agent, or Firm*—Crowell & Moring LLP

(57) ABSTRACT

A device for controlling a vehicle 8 comprising a housing 3, a rectangular printed circuit board 4 which is fixed to the inside of the housing and has a control circuit thereon, and plugs 1*a* and 1*b* provided along one side of the rectangular printed circuit board 4 to transfer signals between the inside and the outside of said housing 3; wherein the plugs 1*a* and 1*b* respectively contain plug pins and the plug pins 2 are electrically connected to the printed circuit board 4 via bonding wires 5 inside the housing 3.

6 Claims, 4 Drawing Sheets

U.S. PATENT DOCUMENTS

| | | |
|---|---|---|
| 6,205,031 B1 | 3/2001 | Herzog et al. |
| 6,341,066 B1 | 1/2002 | Murowaki et al. |
| 6,670,548 B2 * | 12/2003 | Sumida et al. ............... 174/50 |
| 6,710,263 B2 | 3/2004 | Kobayashi et al. |
| 6,724,627 B2 | 4/2004 | Onizuka et al. |
| 7,091,598 B2 | 8/2006 | Fujita et al. |

FOREIGN PATENT DOCUMENTS

| | | |
|---|---|---|
| JP | 10-126924 A | 5/1998 |
| JP | 10-289962 | 10/1998 |
| JP | 11-46426 A | 2/1999 |
| JP | 2000-349557 A | 12/2000 |
| JP | 2001-16746 A | 1/2001 |
| JP | 2001-244376 A | 9/2001 |
| JP | 2001-315591 A | 11/2001 |
| WO | WO02/057921 A1 | 7/2002 |

OTHER PUBLICATIONS

Japanese Office Action dated Dec. 19, 2006 w/English translation (Four (4) pages.

* cited by examiner

DEVICE FOR CONTROLLING A VEHICLE

This application is a continuation of U.S. application Ser. No. 11/375,057, filed Mar. 15, 2006 now U.S. Pat. No. 7,303,406, which is a continuation of U.S. application Ser. No. 10/628,352, filed Jul. 29, 2003, now U.S. Pat. No. 7,018,218 B2 issued Mar. 28, 2006, which claims priority to Japanese Application Serial No. 2002-221132, filed Jul. 30, 2002, the entire disclosure of which is incorporated by reference herein.

BACKGROUND OF THE INVENTION

This invention relates to a device for controlling a vehicle, particularly to a disposition of parts constituting the device for controlling a vehicle and configuration of the parts respectively.

A device for controlling a vehicle accommodates a required electronic circuit and others in a metallic housing equipped with plugs to transfer signals to and from the outside. The plugs are provided in the center of the housing, for example, as disclosed in Japanese laid-open Patent Publication of International application No. Hei 11-505074, namely in a place where a printed circuit board exists or provided on both sides of a printed circuit board as disclosed in Japanese laid-open Patent Publication of International application No. 2001-507522.

Further, a control circuit is made by directly forming necessary circuits on a printed circuit board.

SUMMARY OF THE INVENTION

Usually plugs are connected to the printed circuit board with bonding wires. If the plugs are provided in a place where a printed circuit board exists as in a conventional configuration, the pin arrangement of the plugs becomes complicated. Further when the plugs are provided on both sides of the printed circuit board, the printed circuit board has a tendency to become greater as the printed circuit board requires a bonding space.

Further, if circuits are directly formed on printed circuit boards, the boards must be manufactured separately for models of vehicles when the models have different functions. Further, the boards must be made greater as the number of parts to be mounted increases.

Furthermore, as circuits on printed circuits generate heat, cooling plates are required to cool the circuits. It sometimes happened that some parts could not be cooled by cooling plates effectively and were forced to be abandoned.

Therefore, it is an object of the present invention to provide a device for controlling a vehicle which facilitates connections between plugs and the printed circuit board.

It is another object of the present invention to make it easy to add functions to printed circuit boards and to change the functions thereof.

It is yet a further object of the present invention to cool modules effectively on the printed circuit board.

A device for controlling a vehicle which is an embodiment of the present invention comprises a housing, a rectangular printed circuit board which is fixed to the inside of said housing and has a control circuit on it, and plugs provided along one side of said rectangular printed circuit board to transfer signals between the inside and the outside of said housing: wherein said plugs respectively contain plug pins and the plug pins are electrically connected to said printed circuit board via bonding wires inside said housing.

In the preferred embodiment, the printed circuit board is rectangular and the plugs are arranged on the printed circuit board along the longitudinal side thereof.

In the preferred embodiment, the bonding wires are members of a flexible cable.

In the preferred embodiment, the plugs comprise a first plug which transfers signals related to engine controlling and a second plug which transfers signals related to vehicle controlling.

In the preferred embodiment, a grounding pin is provided on the inner wall of the housing between the plugs to ground the printed circuit board and the grounding pin is connected to the printed circuit board via a bonding wire.

In the preferred embodiment, the printed circuit board has a control circuit made up with modules which perform preset functions.

In the preferred embodiment, the printed circuit board is rectangular.

The plugs comprise a first plug which transfers signals related to engine controlling and a second plug which transfers signals related to vehicle controlling. The first and second plugs are arranged along the longitudinal side of the rectangle and respectively close to each shorter side thereof. A first module containing a CPU to control the other modules is provided about in the longitudinal center of the printed circuit board. A second module to perform a processing related to engine controlling is provided closer to the first plug than the first module. A third module to perform a processing related to vehicle controlling is provided closer to the second plug than the first module.

A device for controlling a vehicle which is an embodiment of the present invention comprises a housing, a printed circuit board which is fixed to the inside of the housing and has a control circuit made up with modules which perform preset functions, plugs for transferring signals between the inside and the outside of the housing, and plug pins in each plug which are electrically connected to the printed circuit board via bonding wires inside the housing.

In the preferred embodiment, the printed circuit board is rectangular, a first module containing a CPU to control the other modules is provided about in the longitudinal center of the printed circuit board, and a second module to perform a processing related to engine or vehicle controlling is provided longitudinally next to the first module.

In the preferred embodiment, the printed circuit board has a multi-layer circuit structure comprising a first ceramic layer, a second layer which is provided on the first layer and has a power supply pattern and a ground pattern thereon, a third layer which is provided on the second layer and has a resistive element thereon, and a fourth layer having wiring patterns of the modules.

In the preferred embodiment, at least one of the modules has a multi-layer supporting board whose layers are separated from each other by an insulating ceramic layer and electrically-interconnected via through-holes.

In the preferred embodiment, any of the layers contains resistor and capacitive elements.

In the preferred embodiment, at least one of the modules has a silicone-made supporting board.

In the preferred embodiment, at least one of the modules has a resin-made supporting board.

In the preferred embodiment, at least one of the modules has a multi-layer supporting board which is separated into layers by a metallic core layer and an insulating resin layer and the layers are electrically interconnected via through-holes or inner via-holes.

DETAILED DESCRIPTION OF THE PREFERRED EMBODIMENTS

A device for controlling a vehicle which is a preferred embodiment of the present invention is described below with reference to the accompanying drawings.

Figure 1:
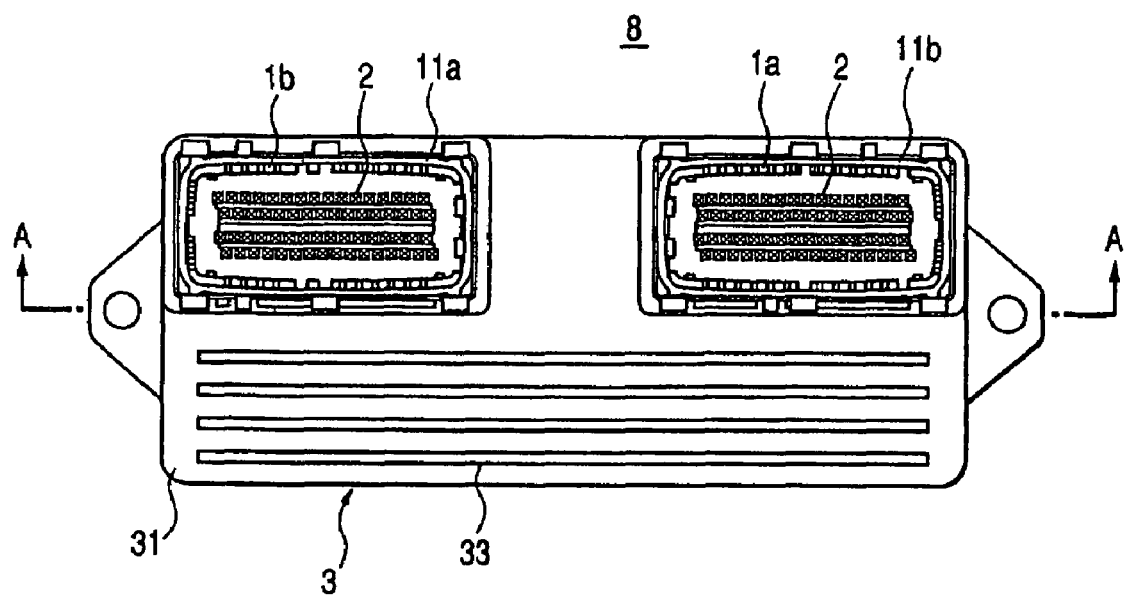
FIG. 1 is a front view of a device for controlling a vehicle in accordance with this embodiment.
Figure 2:
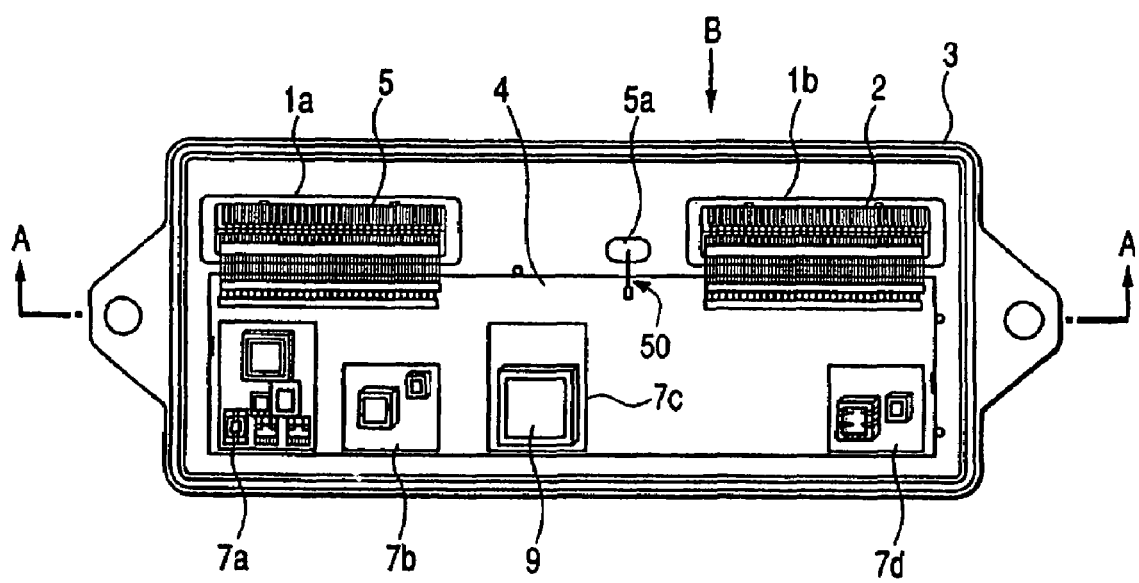
FIG. 2 is a rear view of a device for controlling a vehicle in accordance with this embodiment.
Figure 3:
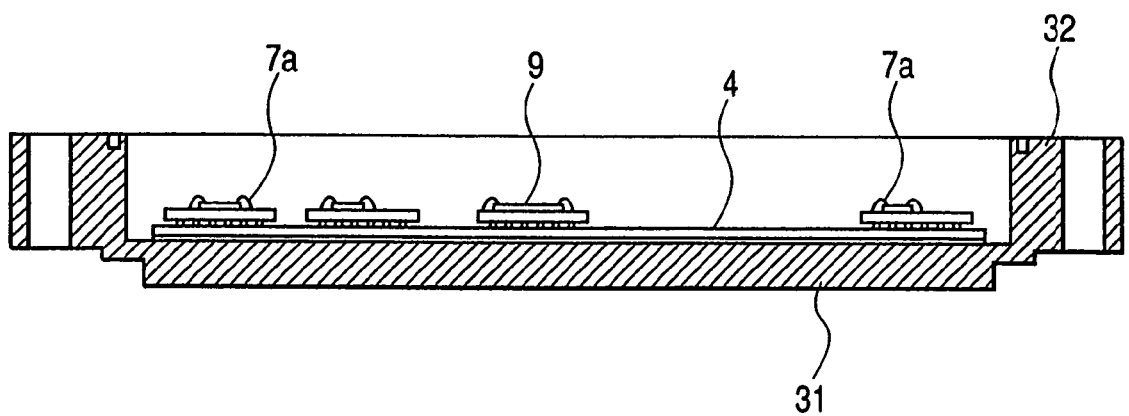
FIG. 3 is a sectional view of a device for controlling a vehicle in accordance with this embodiment.

FIG. 1, FIG. 2, and FIG. 3 respectively show front, rear, and sectional views (in that order) of a device for controlling a vehicle in accordance with this embodiment.

The control device 8 comprises a box-shaped metallic housing 3 which is made up with a bottom 31 and sides 32 and contains a printed circuit board 4 having an electronic circuit on it. The bottom 31 of the housing 3 has a plurality of cooling fins 33 on its outer surface. As shown in FIG. 1, plugs 1 (1a and 1b) are provided on the peripheral surface of the housing 3 to transfer signals between the inside and the outside of the housing. Each plug comprises a plug housing 11 (11a and 11b) and plug pins 2.

The plug 1a is for engine input/output to be connected to the engine and the plug 1b is for vehicle input/output to be connected to vehicle parts to be controlled.

The engine input/output plug 1a inputs signals from engine status sensors such as $O_2$ sensors and crank angle sensors and outputs signals to control concentration of gasoline in each cylinder and ignition timing to engine parts such as injectors and ignition plugs.

The vehicle input/output plug 1b transfers signals to control parts other than the engine. For example, the plug 1b inputs signals indicating revolution speeds of a fuel pump, a radiator fan, and crank shafts and outputs signals to control an in-car panel.

When the inside of the housing 3 is viewed from the rear, a printed circuit board 4 and plugs 1a and 1b (rear views) are provided in a line as shown in FIG. 2. Here, the printed circuit board 4 is rectangular. The plugs 1a and 1b are provided along one side of the printed circuit board 4. Plug pins 2 on the rear of the plug 1 are connected to the printed circuit board 4 with bonding wires 5.

Placing plugs 1 along one side of the printed circuit board 4 facilitates connection of plug pins 2 to the printed circuit board 4 with bonding wires. This reduces the production man-hour. The bonding wires 5 should preferably be aluminum wires and flexible cables.

In this embodiment, the printed circuit board 4 is rectangular and plugs 1a and 1b are arranged along the longitudinal side of the printed circuit board 4 and respectively close to each shorter side thereof.

The printed circuit board 4 also has some multi-chip modules 7 (7a to 7d) thereon. Each multi-chip module 7 is provided for preset functions and contains circuits required to accomplish the functions. For example, the multi-chip module 7c in the center of the printed circuit board 4 contains a CPU 9 which collectively controls the control device. This module 7c is a main module to control the other multi-chip modules 7a, 7b, and 7d. The multi-chip modules 7a, 7b, and 7d contain circuits for accomplishing preset functions to perform engine control or in-car control. Each of these multi-chip modules need not be mounted on a high-density printed circuit board. The boards can be cheap printed circuit boards.

It is easy to form a control circuit on a printed circuit board having a required wiring pattern by combining multi-chip modules each of which contains a preset function as a block. Further, the printed circuit board can be made smaller by mounting multi-chip modules on a single printed circuit board without directly mounting circuits on the board.

In this embodiment, it is preferable that the multi-chip modules 7a and 7b near the engine input/output plug 1a contain functions related to engine controlling and the multi-chip module 7d near the vehicle input/output plug 1b contains functions related to in-car controlling. This can make pattern designing easier and board dimensions smaller. Further, this facilitates designing of harnesses for external signals fed to the plugs.

Further, a grounding terminal (GND) 50 is provided between plugs 1a and 1b. The printed circuit board 4 is connected to this grounding terminal (GND) 50 with a bonding wire 5a to ground the board 4. This can omit a grounding wire from the plug pin 2 and consequently reduces the number of plug pins.

FIG. 3 shows a sectional view taken along the A-A line of the control device 8. The printed circuit board 4 having multi-chip modules 7 thereon is fixed to the bottom 31 of the housing with the whole printed circuit board 4 accommodated in the metallic housing 3.

Figure 4:
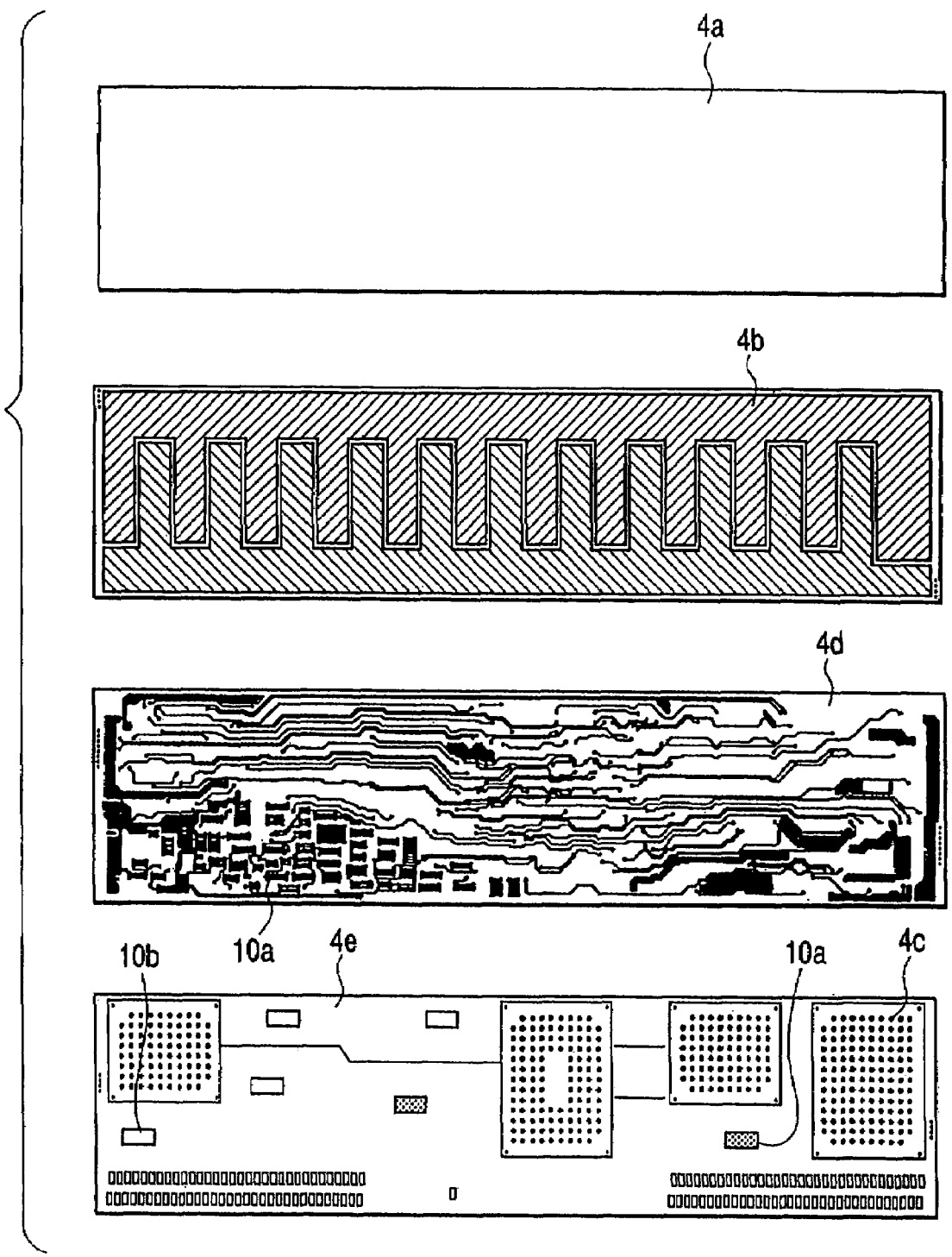
FIG. 4 shows circuit patterns of layers in a 4-layer board.

FIG. 4 shows an example of configuration of the printed circuit board 4. The board 4 is a multi-layer board and has four layers in this embodiment. The first layer (bottom) is a ceramic board 4a. The second layer is a VCC/GND pattern layer 4b having a power supply pattern and a grounding pattern printed as a thin film and a thick film on the ceramic board 4a. The third layer is a resistor layer 4d having a wiring pattern of resistor element 10a. The fourth layer (top) is a wiring pattern layer 4c. By placing the resistor layer 4d between the VCC/GND pattern layer 4b and the wiring pattern layer 4c, it is possible to eliminate resistor chips to be mounted on the wiring pattern layer 4c (top layer). This can make the board 4 smaller. Further, the resistor element 10a can be placed on the wiring pattern layer 4c.

Figure 5:
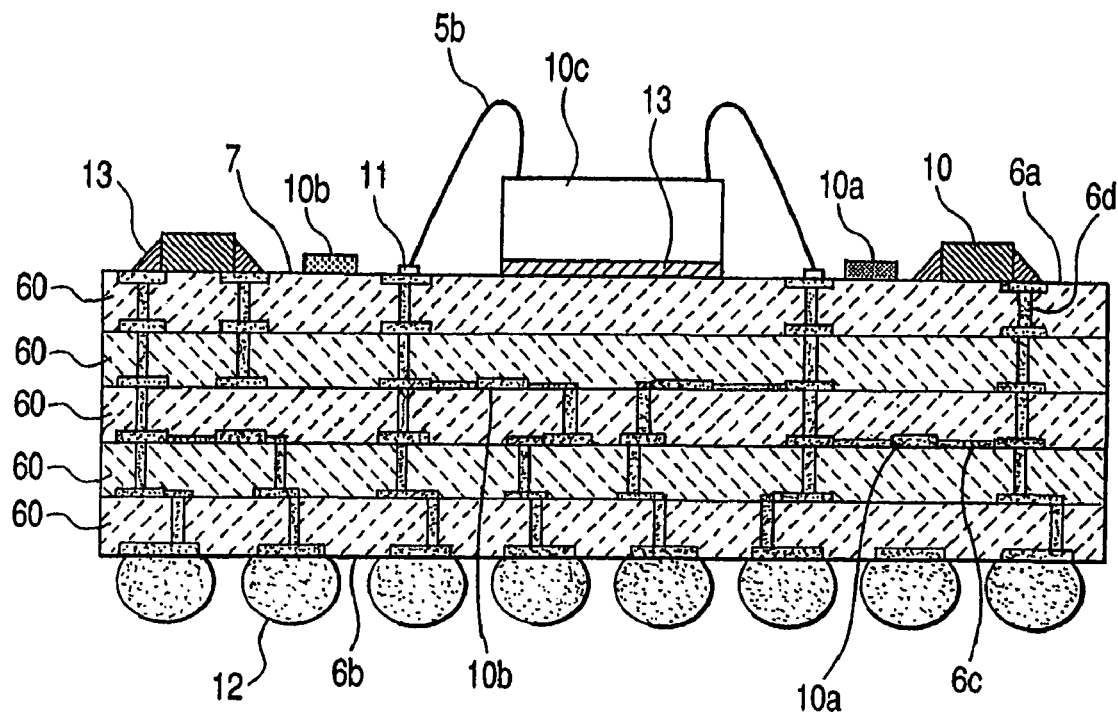
FIG. 5 is a sectional view of a multi-chip module made of a ceramic multi-layer board.

FIG. 5 shows an example of configuration of a multi-chip module 7. This example uses a ceramic multi-layer board as the supporting board 6 of the module 7. The ceramic multi-layer board comprises semiconductor layers 6c whose conductors and electronic parts are separated from each other by insulation ceramic layers 60. The electronic parts 10 on the layers are electrically interconnected by means of through-holes (Via) 6d made on the insulation ceramic layers 60. It is possible to increase the packaging density by hierarchically building up the supporting boards 6. This can also make the multi-chip module smaller in size.

For example, in FIG. 8, the surface 6a and the inner semiconductor layer 6c of the supporting board 6 have electronic parts 10 such as IC chip 10a, resistor element (chip resistor 10b), and capacitive element (chip capacitor 10c). The electronic parts 10 on the surface 6a of the supporting board 6 are connected to the supporting board 6 with bonding wires 5b. The electronic parts 10 on the surface 6a of the supporting board 6 are interconnected with each other by means of the conductor 11 and interconnected with electronic parts on the inner conductor layers 6c by means of the conductor 11 and through-holes (Via) 6d.

It is possible to increase the packing density of the multi-chip module by placing chip resistors 10b and chip capacitors on the surface 6a and inner semiconductor layers 6c of the supporting board 6.

The conductors 11 of the multi-chip module are introduced to the rear side 6b of the supporting board 6 through inner conductor layers by means of through-holes (Via) 6d and connected to solder balls 12 there. The multi-chip modules 7 are placed on the printed circuit board 4 with the solder balls on the printed circuit board 4 and soldered to the printed circuit board 4 by reflow-soldering.

If electronic parts 10 on the surface 6a are solder-connected, the solder may be molten when the multi-chip modules 7 are soldered to the printed circuit board 4. This reduces the reliability of the multi-chip modules 7 remarkably.

To prevent this, an adhesive material 13 containing silver (Ag) as the main ingredient is used to connect electronic parts 10 such as IC chips on the surface 6a to the supporting board 6. This adhesive material 13 will not be molten by reflow-soldering when solder balls 12 on the supporting board 6 are molten for soldering.

It is also possible to use non-ceramic materials for the supporting board 6 of the multi-chip modules 7. For example, the ceramic material of the supporting board 6 can be substituted with silicone or resin material.

A silicone board can make pattern lines thinner. Further the silicone board can have power-related electronic parts thereon as silicone is high exoergic.

Resin boards can comparatively reduce the manufacturing cost of multi-chip modules.

Figure 6:
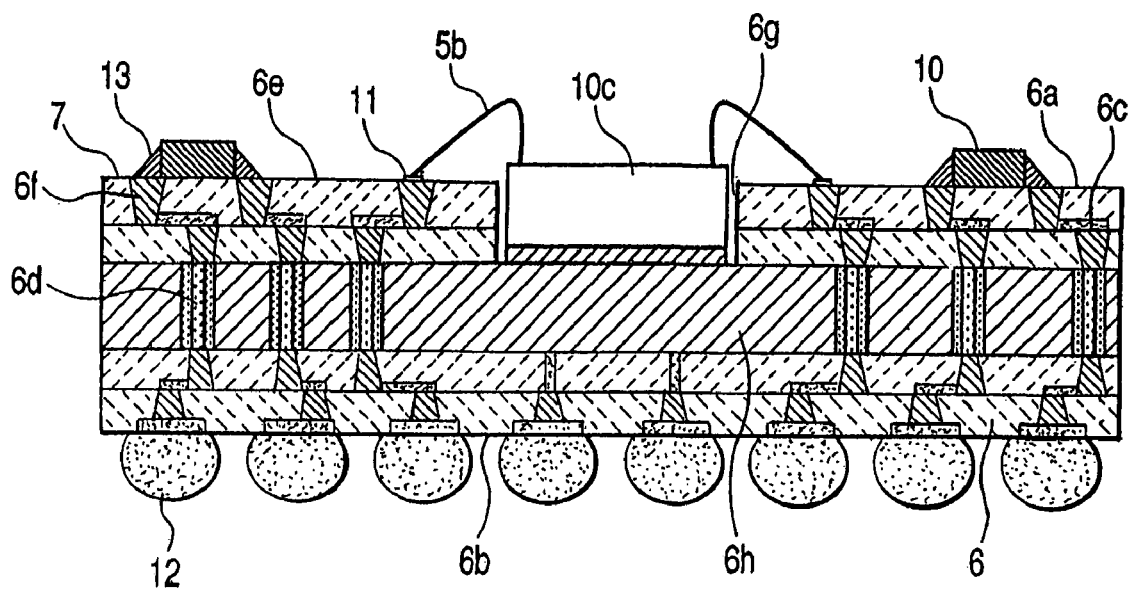
FIG. 6 is a sectional view of a multi-chip module made of a resin multi-layer board.

Further, the supporting board 6 of the multi-chip modules 7 can be substituted with a high exoergic resin multi-layer metal-core board. FIG. 6 shows an example of using a resin multi-layer metal-core board 6e as the supporting base 6.

As well as the ceramic multi-layer boards, silicone boards, and resin boards, the resin multi-layer metal-core board 6e has various electronic parts on its surface 6a. The IC chip 10c is connected to the supporting board 6 with bonding wires 5b.

The electronic parts 10 on the surface 6a of the supporting board 6 are interconnected with each other by means of the conductor 11 and interconnected with electronic parts on the inner conductor layers 6c by means of the conductor 11, through-holes (Via) 6d, and inner via-holes (IVH) 6f.

The conductors 11 of the multi-chip module are introduced to the rear side 6b of the supporting board 6 through inner conductor layers 6c by means of through-holes (Via) 6d and inner via-holes (IVH) 6f and connected to solder balls 12 there. The multi-chip modules 7 are placed on the printed circuit board 4 with the solder balls on the printed circuit board 4 and soldered to the printed circuit board 4 by reflow-soldering.

The board area 6g where the IC chip 10c is mounted is pitted until the metal core layer 6h is exposed. The IC chip 10c is put into this pit to be in direct contact with the surface of the metal core layer 6h. This enables the IC chip 10c to be cooled effectively.

Also in this case as indicated by an example of FIG. 5, an adhesive material 13 containing silver (Ag) as the main ingredient is used to connect electronic parts 10 such as IC chips on the surface 6a to the supporting board 6.

This enables high density mounting of components on the resin multi-layer board and can downsize multi-chip modules and their mounting boards. Further, a metallic multi-layer core material enables mounting and high effective cooling of power-related electronic parts.

Reference signs show the following parts:
1 . . . Plug, 2 . . . Plug pin, 3 . . . Metallic housing, 4 . . . Board, 4a . . . Ceramic layer, 4b . . . VCC/GND pattern layer, 4c . . . Wiring pattern layer, 4d . . . Resistor element layer having wiring patterns, 4e . . . Front layer, 5 . . . Bonding wire, 6 . . . Supporting board, 6a . . . Front surface of the supporting board, 6b . . . Rear surface of the supporting board, 6c . . . Inner conductor layer, 6d . . . Through-hole (Via), 6e . . . Resin multi-layer metal core board, 6f . . . Inner via-hole, 6g . . . IC mounting area, 6h . . . Metal core layer, 7 . . . Multi-chip module, 8 . . . Control device, 9 . . . CPU, 10 . . . Electronic device, 11 . . . Conductor, 12 . . . Solder ball, 13 . . . Adhesive material.

The above embodiments of the present invention are intended to illustrate the invention and are not to be construed to limit the scope of the invention. Those skilled in the art can apply this invention to various embodiments without departing from the spirit of this invention.

What is claimed:

1. A device for controlling a vehicle comprising:
   a housing for said device;
   a printed circuit board fixed to an inside of said housing and having a control circuit thereon; and
   plugs provided along one side of the rectangular printed circuit board to transfer signals between an inside and the outside of said housing;
   wherein said plugs respectively contain plug pins and the plug pins are electrically connected to said printed circuit board with bonding wires inside said housing, and
   said plugs are provided to said housing so as to be oriented in a direction perpendicular to said printed circuit board and so that rear portions of said plugs and said printed circuit board are arranged in parallel when the inside of said housing is viewed from the rear.

2. The device for controlling a vehicle according to claim 1, wherein
   said printed circuit board is rectangular and said plugs are arranged on said printed circuit board along the longitudinal side thereof.

3. The device for controlling a vehicle in accordance with claim 1, wherein
   said bonding wires are a flexible.

4. The device for controlling a vehicle in accordance with claim 1, wherein
   said plugs comprise a first plug which transfers signals related to engine controlling
   and a second plug which transfers signals related to vehicle controlling.

5. The device for controlling a vehicle according to claim 1, wherein
   said printed circuit board has a control circuit made up with modules which perform preset functions.

6. The device for controlling a vehicle in accordance with claim 1, wherein the control circuit comprises modules configured to perform preset functions.

* * * * *